(12) United States Patent
Ogawa

(10) Patent No.: US 11,860,245 B2
(45) Date of Patent: Jan. 2, 2024

(54) MAGNETIC DETECTION DEVICE AND SEMICONDUCTOR INTEGRATED CIRCUIT FOR AMPLIFYING MAGNETIC DETECTION SIGNAL

(71) Applicant: Yutaka Ogawa, Chitose (JP)

(72) Inventor: Yutaka Ogawa, Chitose (JP)

(73) Assignee: MITSUMI ELECTRIC CO., LTD., Tokyo (JP)

(*) Notice: Subject to any disclaimer, the term of this patent is extended or adjusted under 35 U.S.C. 154(b) by 104 days.

(21) Appl. No.: 17/640,406

(22) PCT Filed: Aug. 14, 2020

(86) PCT No.: PCT/JP2020/030830
§ 371 (c)(1),
(2) Date: Mar. 4, 2022

(87) PCT Pub. No.: WO2021/044828
PCT Pub. Date: Mar. 11, 2021

(65) Prior Publication Data
US 2022/0326316 A1 Oct. 13, 2022

(30) Foreign Application Priority Data

Sep. 5, 2019 (JP) .................................. 2019-161642

(51) Int. Cl.
*G01R 33/025* (2006.01)
*G01R 33/07* (2006.01)
*G01R 33/09* (2006.01)

(52) U.S. Cl.
CPC .......... *G01R 33/025* (2013.01); *G01R 33/07* (2013.01); *G01R 33/09* (2013.01)

(58) Field of Classification Search
CPC ...... G01R 33/025; G01R 33/07; G01R 33/09; G01R 33/0029; G01R 19/00

(Continued)

(56) References Cited

U.S. PATENT DOCUMENTS 3,728,676 A * 4/1973 Brown ..................... B60Q 1/22
340/672
4,260,950 A * 4/1981 Hadden .............. G01N 27/4165
324/438

(Continued)

FOREIGN PATENT DOCUMENTS

| JP | 2002-296332 A | 10/2002 |
| JP | 2014-16229 A | 1/2014 |
| JP | 2015-152505 A | 8/2015 |

OTHER PUBLICATIONS

International Search Report of PCT/JP2020/030830 dated Nov. 10, 2020.

(Continued)

*Primary Examiner* — Christopher P McAndrew
(74) *Attorney, Agent, or Firm* — Shih IP Law Group, PLLC.

(57) ABSTRACT

A magnetic detection device that comprises an amplification circuit amplifying a detection signal from a magnetic sensor that is positioned, for example, in a location where an alternating current magnetic field enters as noise, and detects an alternating current magnetic field targeted for monitoring, said magnetic detection device further comprising: timer circuits that are activated in response to a change in the output of the amplification circuit, and if these clock a prescribed time, the outputs thereof change; a logic circuit that treats the outputs of the timer circuits as inputs; and an oscillation circuit for generating an operation clock signal for the timer circuits. The timer circuits are structured such that if the output of the amplification circuit changes to a different direction before the clocking of the prescribed time is complete, the timer circuits are reset.

7 Claims, 4 Drawing Sheets

(58) Field of Classification Search
USPC .......................................................... 324/200
See application file for complete search history.

(56) References Cited

U.S. PATENT DOCUMENTS

| 4,304,237 | A | * | 12/1981 | Mensink | ............. | A61N 1/3727 |
| | | | | | | 607/30 |
| 2010/0225308 | A1 | * | 9/2010 | Kurumado | ............. | G01P 13/04 |
| | | | | | | 324/207.25 |

OTHER PUBLICATIONS

International Preliminary Report on Patentability for PCT/JP2020/030830 dated Mar. 8, 2022.

* cited by examiner

Prior Art

MAGNETIC DETECTION DEVICE AND SEMICONDUCTOR INTEGRATED CIRCUIT FOR AMPLIFYING MAGNETIC DETECTION SIGNAL

This Application is the U.S. National Stacie filing under 35 U.S.C. § 371 of International Application Ser. No. PCT/JP2020/030830 filed on Aug. 14, 2020, which claims the benefit of Japanese Patent Application No. 2019-161642 filed on Sep. 5, 2019.

TECHNICAL FIELD

The present invention relates to a magnetic detection device and a semiconductor integrated circuit for amplifying a magnetic detection signal, and in particular to technology effective for use in canceling an alternating current magnetic field input in a magnetic detection device.

BACKGROUND ART

In recent years, magnetic detection sensors that detect presence or absence and intensity of magnetism have been used in various fields. For example, to detect an operating state of an actuator, a magnet is installed in a movable member of the actuator. A magnetic detection device detects and amplifies the magnetism of the magnet. When such a magnetic detection device is located near an AC power supply or AC transmission line, an AC magnetic field may be input as noise to the magnetic detection sensor, causing false detection.

Conventional inventions for removing noise in magnetic detection devices include those described in Patent Literatures 1-3, for example.

CITATION LIST

Patent Literature

Patent Literature 1: JP 2002-296332 A
Patent Literature 2: JP 2014-16229 A
Patent Literature 3: JP 2015-152505 A

SUMMARY OF INVENTION

Technical Problem

The magnetic detection device described in Patent Literature 1 extracts a noise component induced in an output signal of a sensor. The magnetic detection device adds or subtracts the extracted noise component to the output signal of the sensor to cancel out and remove the noise component in the output signal. The magnetic detection device adjusts the level of noise component added to or subtracted from the output signal of the sensor while the sensor is in standby. However, the magnetic detection device of this invention has a problem that the circuit is complicated and occupies a large area.

The magnetic detection device described in Patent Literature 2 includes an amplifier circuit that extracts and amplifies a high-frequency component of a signal output from a magnetic sensor via the first capacitor. The amplifier circuit is provided with the second capacitor which is close to the first capacitor and which is surface-mounted in the same orientation as the first capacitor. The amplifier circuit is provided with a noise cancellation circuit which removes a noise equivalent to that generated in the first capacitor from an amplified signal based on a signal obtained from the second capacitor. However, the magnetic detection device of this invention is not suitable to be formed as a semiconductor integrated circuit because it uses components such as ceramic capacitors.

The magnetic detection device described in Patent Literature 3 includes an averaging unit. When a noise in the vicinity of a repeated frequency becomes an alias signal and becomes a noise of lower frequency than the repeated frequency in a detection circuit section that processes an output signal from a magnetic sensor, the averaging unit provides an averaging section within the cycle of the repeated frequency so that the amplitude of the noise of lower frequency becomes less than half. The averaging unit performs averaging in the averaging section. However, the purpose of the magnetic detection device of this invention is to remove aliasing noise. Both the problem and the solution to the problem are different from those of the present invention, which removes noise caused by input of an AC magnetic field.

The purpose of the invention is to eliminate noise caused by input of an AC magnetic field without using external components, such as capacitors or resistors, in a magnetic detection device equipped with an amplifier circuit that amplifies detection signals of a magnetic sensor.

Another object of the present invention is to provide a magnetic detection device which can be used in environments with high AC magnetic field strength and which is suitable for semiconductor integrated circuits.

A further object of the present invention is to provide a magnetic detection device and a semiconductor integrated circuit for amplifying a magnetic detection signal that can change the frequency of an AC magnetic field to be removed as noise.

Solution to Problem

To achieve the above object, the present invention is a magnetic detection device including:

an amplifier circuit that amplifies a detection signal from a magnetic sensor that detects an AC magnetic field;

a timer circuit which is started in response to change in an output of the amplifier circuit and whose output changes when the timer circuit has counted a predetermined time;

a logic circuit to which the output of the timer circuit is input; and an oscillation circuit that generates a clock signal for operation of the timer circuit, wherein the timer circuit is reset when the output of the amplifier circuit changes in another direction before the timer circuit counts the predetermined time so that an AC magnetic field with a half cycle shorter than the predetermined time is prevented from changing an output of the logic circuit.

The above configuration can eliminate noise caused by input of an AC magnetic field without using external components such as capacitors or resistors. It can be used in environments with high AC magnetic field strength and does not require components such as ceramic capacitors, making it suitable for semiconductor integrated circuits.

The output of the amplification circuit changes between a first level and a second level.

The timer circuit includes:

a first timer which is started in response to change in the output of the amplification circuit from the first level to the second level and measures a predetermined time; and a second timer which is started in response to change in the output of the amplification circuit from the second level to the first level and measures a predetermined time.

The first timer and second timer are each reset in response to change in the output of the amplifier circuit in a direction different from a direction at a start.

According to the above configuration, before the output of the logic circuit rises to a significant level (magnetic detection level), the first timer is reset so that the logic circuit is prevented from being erroneously operated by an AC magnetic field below a predetermined frequency. After the output of the logic circuit rises to the significant level, the second timer is reset so that the logic circuit is prevented from being erroneously operated by the AC magnetic field below the predetermined frequency.

The logic circuit includes a flip-flop circuit.

An output of the flip-flop circuit changes to a high level or a low level depending on change in an output of the first timer. The output of the flip-flop circuit changes to a low level or a high level depending on change in an output of the second timer.

According to this configuration, the logic circuit can be configured with a relatively simple circuit. The logic circuit can output a signal indicating whether a magnetic field to be monitored has been detected.

Depending on an output state of the amplifier circuit, one of the first and second timers is set to an operational state while another is set to a non-operational state.

Such a configuration reduces power consumption of the circuit.

The magnetic detection device further includes a register for externally setting a predetermined time to be counted by the first timer and/or the second timer.

Such a configuration can change the frequency of an AC magnetic field to be removed as noise by changing a setting value to the register.

Another invention of the present application is a semiconductor integrated circuit for amplifying a magnetic detection signal, including:

the magnetic detection device according to claim 6 which is formed as a semiconductor integrated circuit on a semiconductor substrate, wherein the register is configured to accept setting values as serial data input from an external terminal provided in the semiconductor integrated circuit.

According to the semiconductor integrated circuit with the above configuration, setting values can be input to the register without significantly increasing the number of external terminals.

Advantageous Effects of Invention

According to the present invention, in a magnetic detection device equipped with an amplification circuit that amplifies detection signals of a magnetic sensor, noise caused by input of an AC magnetic field is eliminated without using components such as capacitors or resistors outside the circuit. The magnetic detection device can be used in environments with high AC magnetic field strength and is suitable for semiconductor integrated circuits. Furthermore, the present invention has advantageous effect of providing a magnetic detection device and a semiconductor integrated circuit for amplifying a magnetic detection signal that can change the frequency of an AC magnetic field to be removed as noise.

DESCRIPTION OF EMBODIMENTS

Embodiments of the invention will be described in detail with reference to the drawings.

Figure 1:
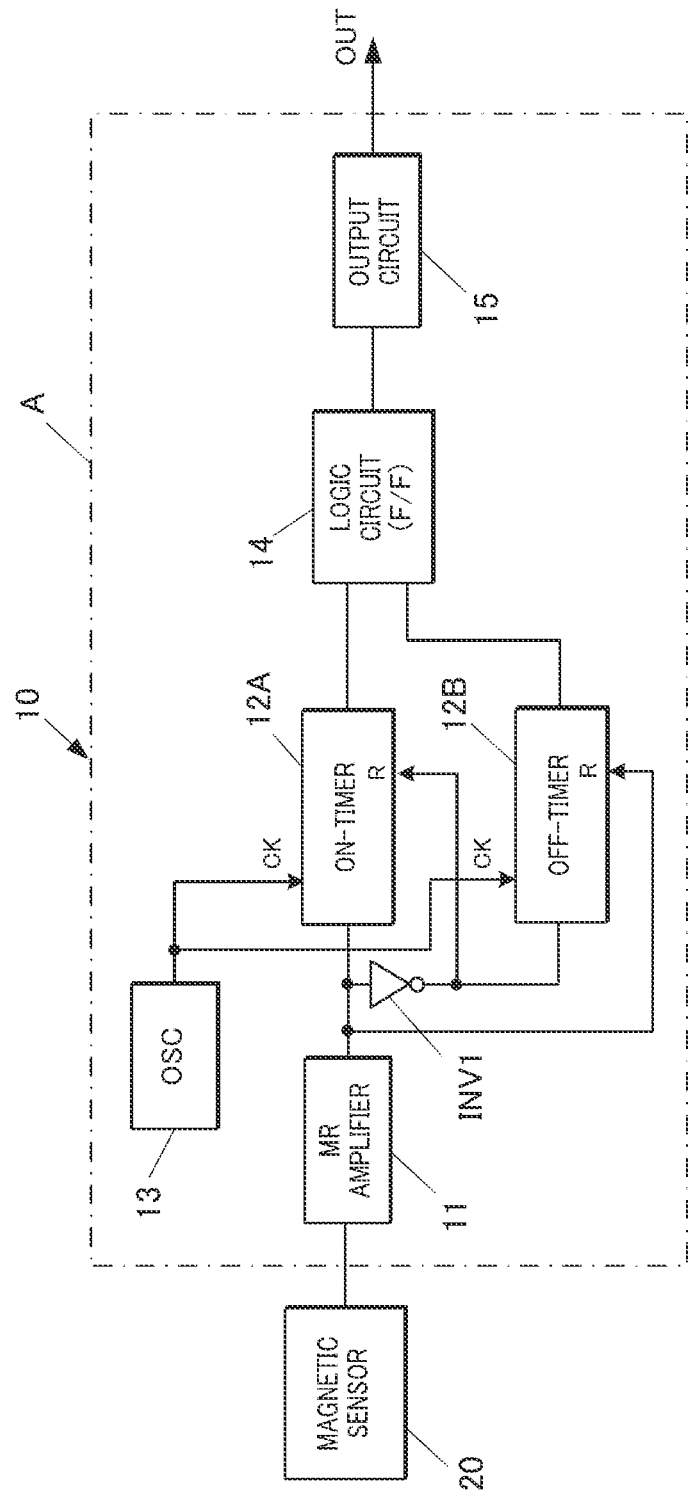
FIG. 1 is a circuit diagram of an embodiment of a magnetic detection device according to the invention.

FIG. 1 is a circuit diagram of a magnetic detection device according to an embodiment of the invention. In the magnetic detection device 10 in FIG. 1, the circuit elements in the range enclosed by the dashed line A are formed as a semiconductor integrated circuit (IC for magnetic detection) on a single semiconductor substrate (semiconductor chip). The present invention is not limited to this. Elements that constitute the magnetic sensor 20 may also be formed on a single semiconductor chip along with elements that constitute a detection circuit. For example, a Hall element or magnetoresistive element can be used as the magnetic sensor 20.

The magnetic detection device 10 of the embodiment includes:

an amplifier circuit (MR amplifier) 11 that amplifies detection signals of the magnetic sensor 20;

an on-timer circuit 12A that counts a predetermined set time in synchronization with the rising edge of an output signal of the amplifier circuit 11;

an off-timer circuit 12B that counts a predetermined set time in synchronization with the falling edge of the output signal of the amplification circuit 11; and an oscillation circuit (OSC) 13 that generates an operation clock signal CK for the timer circuits 12A, 12B.

The timer circuits 12A, 12B can be configured with a counter circuit.

The magnetic detection device 10 includes:

a logic circuit 14 to which output signals of the timer circuits 12A, 12B are input; and an output driver circuit 15 that receives an output signal of the logic circuit 14 and generates a signal OUT (magnetic detection output) which is to be output outside the chip.

The on-timer circuit 12A starts counting time in synchronization with the rising edge of the output signal of the amplifier circuit 11. After the on-timer circuit 12A counts the predetermined time, the output of the on-timer circuit 12A changes to a high level. The on-timer circuit 12A is reset by change in a signal to a high level, the signal being obtained by inverting the output signal of the amplifier circuit 11 with the inverter INV1. The output of the on-timer circuit 12A changes to a low level. On the other hand, the signal obtained by inverting the output signal of the amplifier circuit 11 with the inverter INV1 makes the off-timer circuit 12B start counting time in synchronization with the falling edge of the output signal of the amplifier circuit 11. After the on-timer circuit 12B counts the predetermined time, the output of the on-timer circuit 12B changes to a high level. The off-timer circuit 12B is reset by change in the output signal of the amplifier circuit 11 to a high level. The output of the on-timer circuit 12B changes to a low level.

For example, the amplification circuit 11 includes:

an amplifier with an output that varies according to potential of an input; and a comparator that compares the output of the amplifier with a predetermined voltage.

The oscillation circuit 13 can be configured with a ring oscillator or the like.

The logic circuit 14 can be configured with an RS flip-flop. When the output of the on-timer circuit 12A changes to a high level, an output of the logic circuit 14 changes to a high level and keeps its output state. When the output of the off-timer circuit 12B changes to a high level, the output of the logic circuit 14 changes to a low level and keeps its output state.

Figure 2:
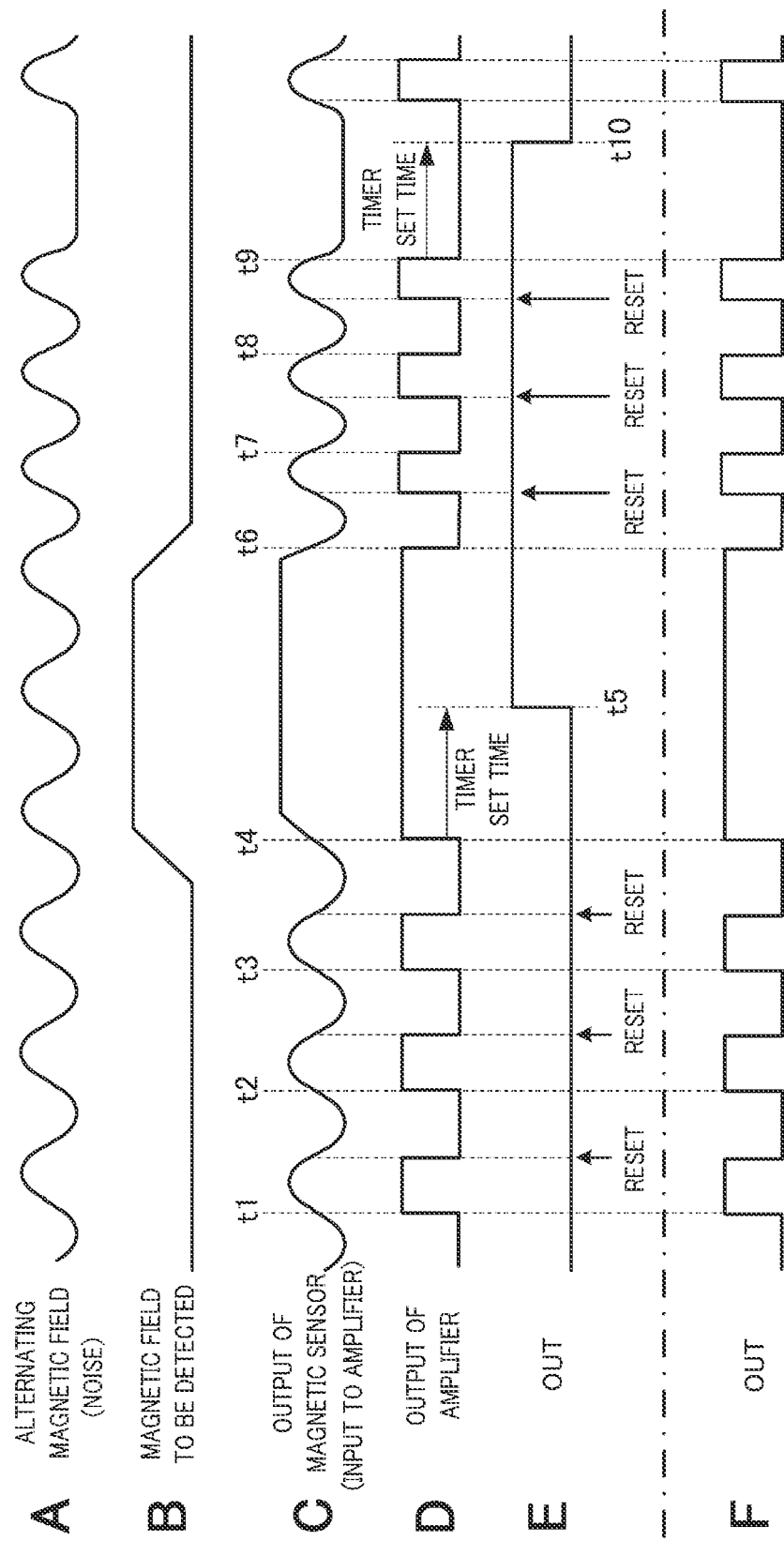
FIG. 2 shows timing charts. A to E are timing charts that show changes in an AC magnetic field as noise, a magnetic field to be detected, an output of a magnetic sensor, an output of an amplifier, and an output of a circuit in the magnetic detection device of the embodiment. F is a timing chart that shows change in a circuit output in a magnetic detection device without a timer circuit.

Next, functions of the magnetic detection device 10 will be explained using timing charts in FIG. 2.

Figure 4:
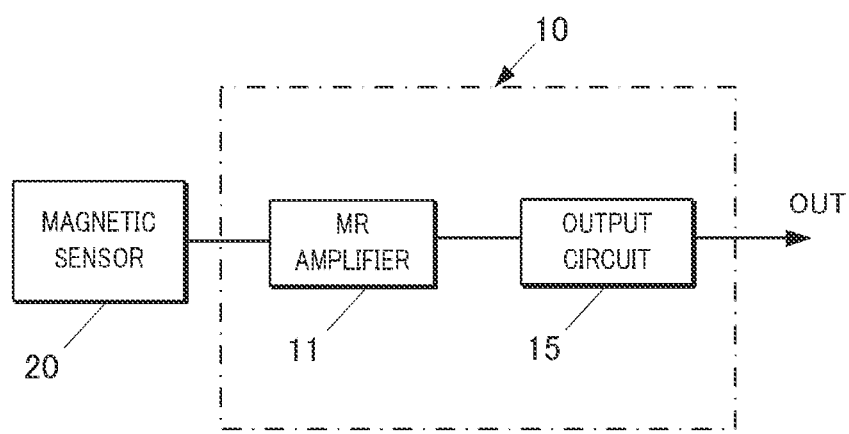
FIG. 4 is a circuit diagram of an example of a conventional magnetic detection device.

A conventional detection circuit shown in FIG. 4 does not have the timer circuits 12A, 12B and the logic circuit 14 in the magnetic detection device 10 shown in FIG. 1. In this case, when the magnetic sensor 20 is placed in an environment with an AC magnetic field as shown in FIG. 2(A) and a magnetic field to be detected as shown in FIG. 2(B) enters the magnetic sensor 20, the output of the magnetic sensor 20 changes as shown in FIG. 2(C). The output of the amplification circuit 11 changes as shown in FIG. 2(D). Then, the signal OUT output from the output driver circuit 15 becomes a signal containing noise due to the AC magnetic field, as shown in FIG. 2(F).

In contrast, in the magnetic detection device 10 of the embodiment, when the output of the amplifier circuit 11 changes as shown in FIG. 2(D), the on-timer circuit 12A starts counting time at time points t1, t2, t3 of the rising edge of the output signal of the amplifier circuit 11. When the output signal of the amplifier circuit 11 drops before a predetermined time is measured, a reset is applied. As shown in FIG. 2(E), noise is removed from the output signal OUT. The output signal of the amplifier circuit 11 rises at the time point t4 due to change in the magnetic field to be detected. At the time point t5 at which a predetermined time has been counted since the time point t4, the output signal OUT changes to a high level.

After the output signal OUT rises, when the output of the amplifier circuit 11 changes as shown in FIG. (D), the off-timer circuit 12B starts counting time at timing points t6, t7, t8 of the falling edge of the output signal of the amplifier circuit 11. When the output signal of the amplifier circuit 11 rises before a predetermined time is counted, a reset is applied. As shown in FIG. 2(E), noise is removed from the output signal OUT. The output signal of the amplifier circuit 11 falls at the time point t9 due to change in the magnetic field to be detected. At the time point t10 at which a predetermined time has been counted since the time point 9, the output signal OUT changes to a low level.

Thus, the magnetic detection device 10 of the embodiment can eliminate noise caused by an AC magnetic field below a predetermined frequency by setting time to be counted by the variable timer circuits 12A, 12B. The magnetic detection device 10 can eliminate noise caused by an AC magnetic field without using external components such as capacitors or resistors. For example, the magnetic detection device 10 can eliminate noise below 50 Hz by setting the time to be counted by the timer circuits 12A, 12B to 10 ms.

Next, the second example of the magnetic detection device 10 of the embodiment will be described using FIG. 3.

Figure 3:
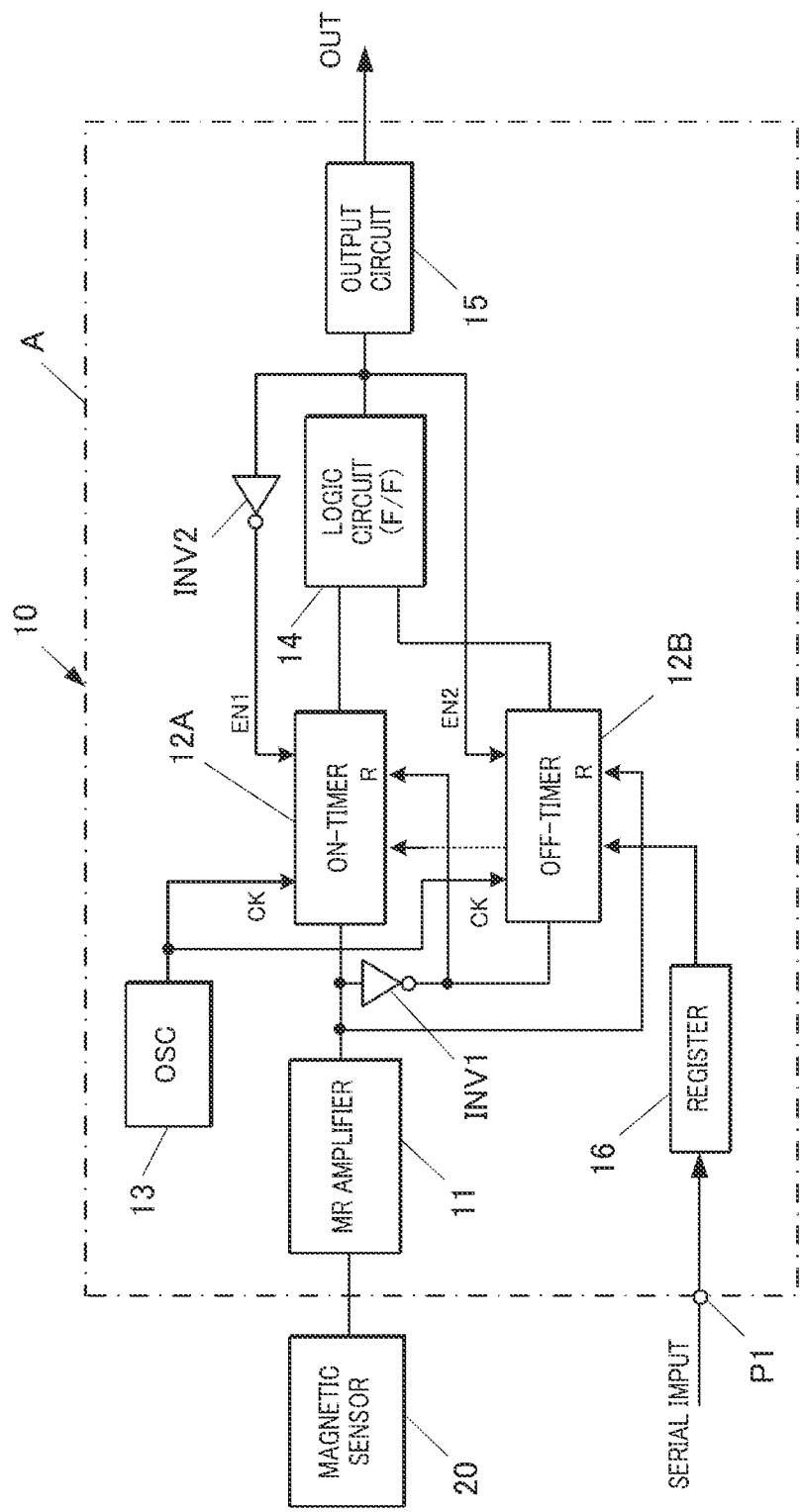
FIG. 3 shows a circuit diagram of the second example of the magnetic detection device according to the invention.

As shown in FIG. 3, the second example of the magnetic detection device includes:

a register 16 for externally setting a predetermined time to be counted by the timer circuits 12A, 12B; and an external terminal P1 for inputting setting values.

According to the configuration described above, the frequency of an AC magnetic field to be removed can be set arbitrarily by changing the value set in the register 16. To reduce the number of terminals, the register 16 should be a shift register that allows serial input of data from the outside. Two registers 16 may be provided so that the time to be counted by the on-timer circuit 12A and the time to be counted by the off-timer circuit 12B can be set separately.

In the magnetic detection device of the example shown in FIG. 3, an inverter INV2 that inverts the output of the logic circuit 14 is provided.

A signal inverted by the inverter INV2 is supplied to the on-timer circuit 12A as an enable signal EN1 which permits time-counting of the on-timer circuit 12A.

The output signal of logic circuit 14 is supplied to off-timer circuit 12B as an enable signal EN2 which permits time-counting of the off-timer circuit 12B.

According to the magnetic detection device with the above configuration, time-counting of the off-timer circuit 12B can be stopped while the on-timer circuit 12A is counting time. Time-counting of the on-timer circuit 12A can be stopped while the off-timer circuit 12B is counting time. It brings advantage that power consumption of the circuit is reduced.

Embodiments of the invention are described above. The present invention is not limited to those embodiments.

For example, in the above embodiment, the amplifier circuit 11 includes:

the amplifier with the output that varies according to potential of the input; and the comparator that compares the output of the amplifier with a predetermined voltage.

Alternatively, the amplifier circuit 11 may consist of an amplifier and a Schmitt trigger circuit, or it may be an amplifier with an output characterized by change between high and low levels.

In the above embodiment, an oscillation circuit 13 that generates clock signals for time-counting of the timer circuits 12A, 12B is provided in the chip. Alternatively, an external terminal for inputting clock signals from outside may be provided so that the oscillation circuit 13 can be omitted.

INDUSTRIAL APPLICABILITY

Application of the invention is not limited to detection of an operating state of an actuator. The invention can be widely used in magnetic detection devices that amplify output signals from magnetic sensors which are placed at locations where AC magnetic fields may appear as noise and which detect the magnetic fields to be monitored, such as a magnetic sensor that detects a position of a motor rotor.

REFERENCE SIGNS LIST

10 Magnetic detection device
11 Amplifier circuit
12A On-timer circuit (first timer)
12B Off-timer circuit (second timer)
13 Oscillation circuit
14 Logic circuit
15 Output driver circuit 16 Register
20 Magnetic sensor
OUT Magnetic detection output

What is claimed is:

1. A magnetic detection device, comprising:
    an amplifier circuit that amplifies a detection signal from a magnetic sensor that detects an AC magnetic field;
    a timer circuit which is started in response to change in an output of the amplifier circuit and whose output changes when the timer circuit has counted a predetermined time;
    a logic circuit to which the output of the timer circuit is input; and
    an oscillation circuit that generates a clock signal for operation of the timer circuit,
    wherein the timer circuit is reset when the output of the amplifier circuit changes in another direction before the timer circuit counts the predetermined time so that an AC magnetic field with a half cycle shorter than the predetermined time is prevented from changing an output of the logic circuit.

2. The magnetic detection device according to claim 1, wherein
    the output of the amplification circuit changes between a first level and a second level,
    the timer circuit comprises:
        a first timer which is started in response to change in the output of the amplification circuit from the first level to the second level and measures a predetermined time; and
        a second timer which is started in response to change in the output of the amplification circuit from the second level to the first level and measures a predetermined time, and
    the first timer and second timer are each reset in response to change in the output of the amplifier circuit in a direction different from a direction at a start.

3. The magnetic detection device according to claim 2, wherein
    the logic circuit includes a flip-flop circuit,
    an output of the flip-flop circuit changes to a high level or a low level depending on change in an output of the first timer, and
    the output of the flip-flop circuit changes to a low level or a high level depending on change in an output of the second timer.

4. The magnetic detection device according to claim 2, wherein, depending on an output state of the amplifier circuit, one of the first and second timers is set to an operational state while another is set to a non-operational state.

5. The magnetic detection device according to claim 3, wherein, depending on an output state of the amplifier circuit, one of the first and second timers is set to an operational state while another is set to a non-operational state.

6. The magnetic detection device according to claim 2, further comprising:
    a register for externally setting a predetermined time to be counted by the first timer and/or the second timer.

7. A semiconductor integrated circuit for amplifying a magnetic detection signal, comprising:
    the magnetic detection device according to claim 6 which is formed as a semiconductor integrated circuit on a semiconductor substrate,
    wherein the register is configured to accept setting values as serial data input from an external terminal provided in the semiconductor integrated circuit.

* * * * *